US012207527B2

(12) United States Patent
Lin

(10) Patent No.: US 12,207,527 B2
(45) Date of Patent: Jan. 21, 2025

(54) DISPLAY PANEL INCLUDING MESH BLOCKING PORTION

(71) Applicant: Wuhan China Star Optoelectronics Semiconductor Display Technology Co., Ltd., Wuhan (CN)

(72) Inventor: Qinzun Lin, Wuhan (CN)

(73) Assignee: Wuhan China Star Optoelectronics Semiconductor Display Technology Co., Ltd., Wuhan (CN)

( * ) Notice: Subject to any disclaimer, the term of this patent is extended or adjusted under 35 U.S.C. 154(b) by 541 days.

(21) Appl. No.: 16/488,614

(22) PCT Filed: May 23, 2019

(86) PCT No.: PCT/CN2019/088116
§ 371 (c)(1),
(2) Date: Sep. 9, 2021

(87) PCT Pub. No.: WO2020/220415
PCT Pub. Date: Nov. 5, 2020

(65) Prior Publication Data
US 2022/0130917 A1    Apr. 28, 2022

(30) Foreign Application Priority Data
Apr. 30, 2019    (CN) .......................... 201910360021.7

(51) Int. Cl.
*H10K 59/88*    (2023.01)
*H10K 50/84*    (2023.01)
(Continued)

(52) U.S. Cl.
CPC .......... *H10K 59/88* (2023.02); *H10K 50/844* (2023.02); *H10K 59/122* (2023.02);
(Continued)

(58) Field of Classification Search
CPC ............. H10K 50/844; H10K 50/8428; H10K 50/865; H10K 59/88; H10K 59/122;
(Continued)

(56) References Cited

U.S. PATENT DOCUMENTS

2014/0097430 A1    4/2014 Park et al.
2016/0043346 A1*   2/2016 Kamiya ............ H10K 59/8731
257/40
(Continued)

FOREIGN PATENT DOCUMENTS

CN    107910296 A    4/2018
CN    208622766 U    3/2019

*Primary Examiner* — Ida M Soward
(74) *Attorney, Agent, or Firm* — PV IP PC; Wei Te Chung

(57) ABSTRACT

A display panel is provided and includes at least one cutting section and a functional section. A cross-sectional structure of the display panel includes a substrate, a blocking portion, and an encapsulating layer. The substrate includes a first sub-portion corresponding to a position of the cutting section. The blocking portion is disposed on the first sub-portion. The encapsulating layer is disposed on the blocking portion. A contact surface between the encapsulating layer and the blocking portion is a rugged surface.

19 Claims, 3 Drawing Sheets

(51) Int. Cl.
  *H10K 50/844* (2023.01)
  *H10K 59/12* (2023.01)
  *H10K 59/122* (2023.01)
  *H10K 77/10* (2023.01)
  *H10K 50/86* (2023.01)
  *H10K 59/124* (2023.01)
  *H10K 59/126* (2023.01)
  *H10K 59/38* (2023.01)
  *H10K 59/80* (2023.01)
  *H10K 102/00* (2023.01)

(52) U.S. Cl.
  CPC .. *H10K 77/111* (2023.02); *H05K 2201/09909* (2013.01); *H10K 50/865* (2023.02); *H10K 59/124* (2023.02); *H10K 59/126* (2023.02); *H10K 59/38* (2023.02); *H10K 59/8792* (2023.02); *H10K 2102/311* (2023.02)

(58) Field of Classification Search
  CPC .... H10K 59/12; H10K 59/124; H10K 59/126; H10K 59/8792; H10K 59/38; H10K 77/111; H10K 2102/311; H05K 2201/09909

See application file for complete search history.

(56) References Cited

U.S. PATENT DOCUMENTS

| | | | |
|---|---|---|---|
| 2016/0336541 A1* | 11/2016 | Kim | H10K 50/8445 |
| 2018/0124933 A1* | 5/2018 | Park | H10K 59/00 |
| 2018/0151833 A1* | 5/2018 | Riegel | H10K 71/00 |
| 2018/0226454 A1* | 8/2018 | Liu | H10K 59/124 |
| 2018/0348913 A1* | 12/2018 | Lee | G06F 3/0412 |
| 2019/0074479 A1* | 3/2019 | Lee | H10K 50/844 |
| 2019/0131379 A1* | 5/2019 | Won | H10K 50/844 |
| 2019/0131572 A1* | 5/2019 | Gwon | G09G 3/3225 |
| 2019/0146608 A1* | 5/2019 | Lee | G06F 3/0416 |
| | | | 345/174 |
| 2019/0181362 A1 | 6/2019 | Tian et al. | |
| 2020/0006703 A1* | 1/2020 | Zhang | H10K 59/873 |
| 2020/0203660 A1* | 6/2020 | Shi | H10K 59/873 |

* cited by examiner

FIG. 1-Prior art

DISPLAY PANEL INCLUDING MESH BLOCKING PORTION

FIELD OF INVENTION

The present application relates to a field of display technologies, and more particularly to a display panel.

BACKGROUND OF INVENTION

Flexible displays (also known as flexible display devices) possess many characteristics, such as being lighter in weight, thinner, bendable, or even being curlable, and good mechanical properties. Therefore, flexible displays are widely used in electronic products, such as smart cards, electronic papers, and smart labels.

As shown in FIG. 1, after a thin-film encapsulation, an encapsulation layer 110 extends from a functional section 101 to a cutting section 102. During a cutting process of a narrow bezel of a display panel, the encapsulation layer 110 that is adjacent to a cutting line 120 is prone to cracking. The cracks easily spread along a cutting edge towards the functional section 101 during the cutting process or a subsequent bending. Therefore, effect of the encapsulation is reduced.

Therefore, it is necessary to provide a display panel to solve problems of the prior art.

SUMMARY OF INVENTION

An object of the present disclosure to provide a display panel capable of enhancing an effect of the encapsulation.

In order to solve the above technical problem, the present disclosure provides a display panel, comprising at least one cutting section and a functional section; wherein a cross-sectional structure of the display panel comprises:
- a substrate comprising a first sub-portion and a second sub-portion, wherein the first sub-portion corresponds to a position of the cutting section and the second sub-portion corresponds to a position of the functional section;
- a blocking portion disposed on the first sub-portion and comprising a plurality of meshes at a top view angle; and
- an encapsulation layer disposed on the blocking portion, wherein a contact surface between the encapsulation layer and the blocking portion is a rugged surface.

The present disclosure provides a display panel, comprising at least one cutting section and a functional section; wherein a cross-sectional structure of the display panel comprises:
- a substrate comprising a first sub-portion corresponding to a position of the cutting section;
- a blocking portion disposed on the first sub-portion; and
- an encapsulation layer disposed on the blocking portion and a contact surface between the encapsulation layer and the blocking portion is a rugged surface.

In the display panel of the present disclosure, a blocking portion is disposed on a substrate of a cutting section and then an encapsulation layer is formed on the blocking portion. A contact surface between the encapsulation layer and the blocking portion is a rugged surface. Because the blocking portion is disposed on the cutting section, the contact surface between the encapsulating layer and the blocking portion is an uneven surface, thereby preventing cracks of the encapsulating layer from extending from cracks of the cutting section to the functional section, i.e., extension of the cracks is effectively blocks and an effect of the encapsulation is further enhanced.

DETAILED DESCRIPTION OF PREFERRED EMBODIMENTS

In the following detailed description, reference is made to the accompanying figures, in which various examples are shown by way of illustration. In this regard, directional terminology mentioned in the present disclosure, such as "top", "bottom", "front", "back", "left", "right", "inner", "outer", "lateral", etc., is used with reference to the orientation of the figures being described. Therefore, the directional terminology is used for purposes of illustration and is not intended to limit the present invention. In the accompanying figures, units with similar structures are indicated by the same reference numbers.

Figure 1:
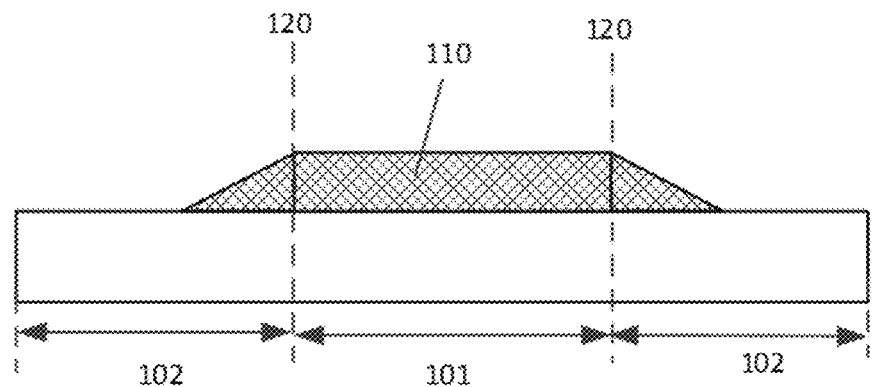
FIG. 1 is a schematic structural view of a conventional display panel.
Figure 2:
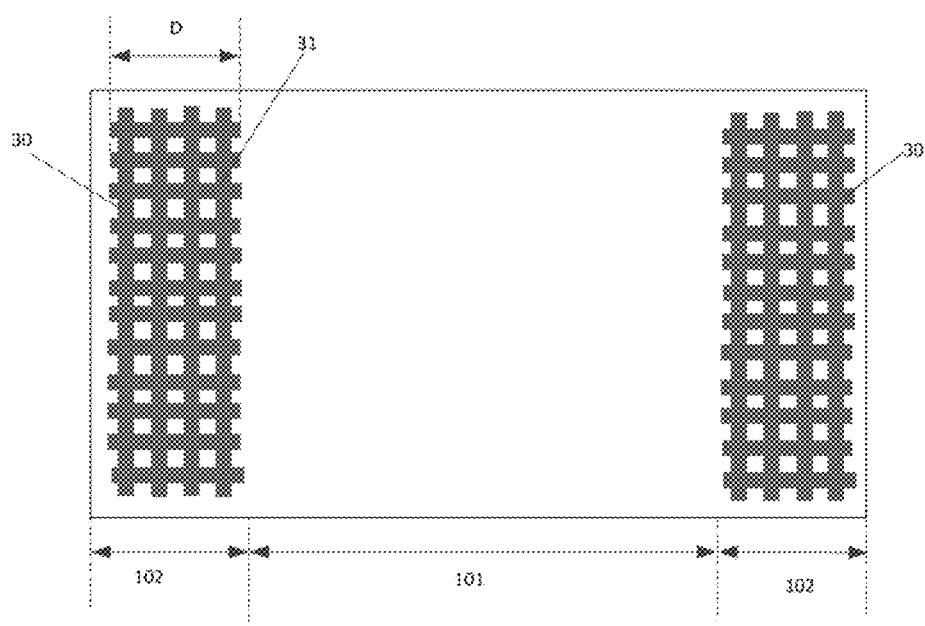
FIG. 2 is a top view of a display panel of the present disclosure.
Figure 3:
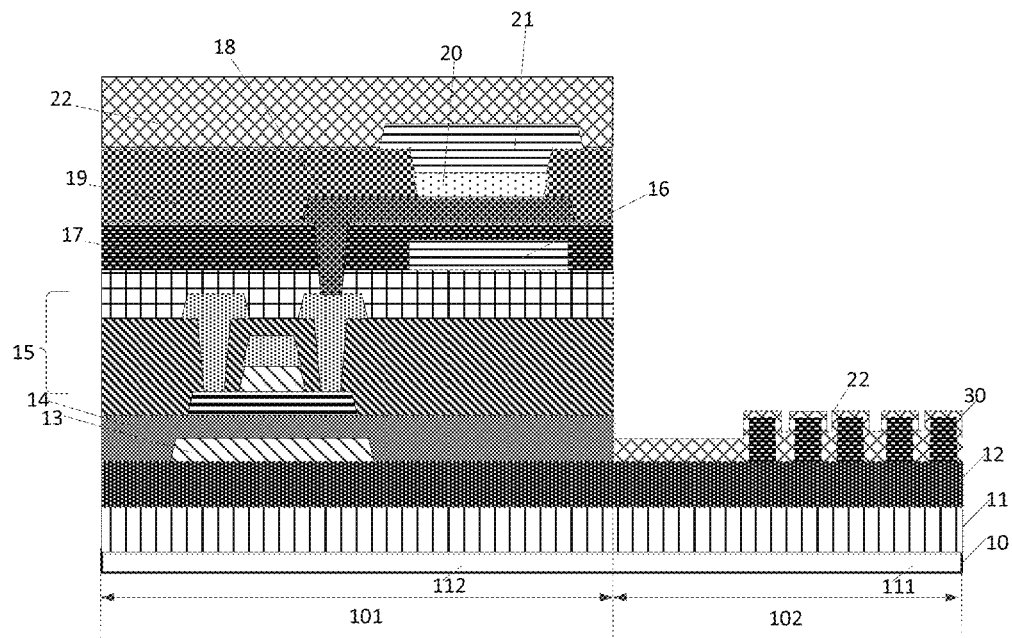
FIG. 3 is a schematic structural view of a display panel of the present disclosure.
Figure 4:
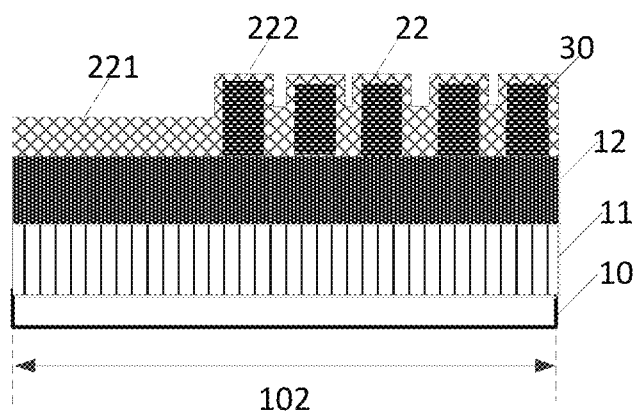
FIG. 4 is a schematic structural view of a cutting section of the present disclosure.

Please refer to FIG. 2-4. FIG. 2 is a top view of the display panel of the present disclosure.

A display panel of the present disclosure includes two cutting sections 102 and a functional section 101. The functional section 101 is positioned between the two cutting sections 102. It is appreciated that a number of the cutting sections 102 is not limited to two, and can also be one, two, or more.

Combining with FIG. 3, a cross-sectional structure of the display panel includes a substrate 10, a blocking portion 30, and an encapsulation layer 22. Only a cross-sectional view of a right side of the cutting section 102 is shown in FIG. 3.

The substrate 10 includes a first sub-portion 111 that corresponds to a position of the cutting section 102. The substrate can further include a second sub-portion 112 that corresponds to a position of the functional section 101. Before the cutting process, the first sub-portion 111 and the second sub-portion 112 are integrally formed, i.e., connected to each other.

The blocking portion 30 is disposed on the first sub-portion 111. In an embodiment, combining with FIG. 2, the blocking portion 30 includes a plurality of meshes at a top view angle. Shapes of the meshes in a top view each comprises at least one of a triangle, a trapezoid, a rectangle, and a circle. It is appreciated that Shapes of the meshes are not limited to the above-mentioned shapes and can also be an ellipse or the like. In order to further improve the blocking effect of the blocking portion, the blocking portion 30 is composed of a plurality of staggered mesh lines 31 having a width ranging from 0.1 μm to 5 μm. A gap between the mesh lines 31 is set as required. In one embodiment, a width D of the blocking portion 30 ranges from 0.1 μm to 10 μm. In order to better release the stress during the bending process or the cutting process, material of the blocking portion 30 is an organic insulation material.

The encapsulation layer 22 is disposed on the blocking portion 30 and a contact surface between the encapsulating layer 22 and the blocking portion 30 is a rugged surface. Combining FIG. 4, the encapsulation layer 22 includes a flat portion 221 and a convex portion 222. The encapsulation layer here is an encapsulation layer positioned on the cutting section 102. In order to further enhance a blocking effect of the blocking portion, a height of the blocking portion 30 is greater than a height of the flat portion 221 of the encapsulation layer 22. In an embodiment, a height of the blocking portion 30 ranges from 1 um to 3 μm. It can be understood that during the manufacturing process, the blocking portion 30 is first formed and the encapsulation layer is subsequently formed.

Back to FIG. 3, the display panel can further include a flexible substrate 11 disposed between the substrate 10 and the blocking portion 30.

The display panel can further include a buffer layer 12 disposed between the flexible substrate 11 and the blocking portion 30.

A cross-sectional structure of the display panel further includes a switch array layer 15, a flat layer 17, an anode 18, and a pixel defining layer 19. The display panel can further include a light-shielding layer 13, a first insulating layer 14, a color resist layer 16, an organic light-emitting layer 20, and a cathode 21.

The switch array layer 15 is disposed on the second sub-portion 112. The switch array layer 15 includes a plurality of switching elements. A cross-sectional structure thereof includes a semiconductor layer, a gate, a source, and a drain. In one embodiment, the light-shielding layer 13 is disposed on the buffer layer 12. The first insulating layer 14 is disposed on the light-shielding layer 13. The switch array layer 15 is disposed on the first insulating layer 14. The color resist 16 is disposed on the switch array layer 15.

A flat layer 17 is disposed on the color resist 16. An anode 18 is disposed on the flat layer 17. The anode 18 is connected to the drain. A pixel defining layer 19 is disposed on the anode 18. The pixel defining layer 19 is provided with an opening section. The organic light-emitting layer 20 is located within the opening section. The cathode 21 is located on the organic light-emitting layer 20. The cathode 21 is also provided with an encapsulation layer 22 disposed on the cathode 21.

In one embodiment, the blocking portion 30 and the flat layer 17 are formed in a same process, i.e., during a process of depositing the flat layer, the flat layer is also deposited on the buffer layer 12. The flat layer of the cutting section is then patterned to obtain the blocking portion 30.

In another embodiment, the blocking portion 30 and the pixel defining layer 19 are formed in a same process, i.e., during a process of depositing the pixel defining layer 19, the pixel defining layer is also deposited on the buffer layer 12. The pixel defining layer of the cutting section is then patterned to obtain the blocking portion 30.

Because the blocking portion is disposed on the cutting section, the contact surface between the encapsulating layer and the blocking portion is an uneven surface, thereby preventing cracks of the encapsulating layer from extending from cracks of the cutting section to the functional section. An effect of the encapsulation is further enhanced. In addition, service lives of products can be increased.

In the display panel of the present disclosure, a blocking portion is disposed on a substrate of a cutting section and then an encapsulation layer is formed on the blocking portion. A contact surface between the encapsulation layer and the blocking portion is a rugged surface. Because the blocking portion is disposed on the cutting section, the contact surface between the encapsulating layer and the blocking portion is an uneven surface, thereby preventing cracks of the encapsulating layer from extending from cracks of the cutting section to the functional section, i.e., extension of the cracks is effectively blocks and an effect of the encapsulation is further enhanced.

In summary, although the present disclosure has been described with preferred embodiments thereof, the above preferred embodiments is not used to limit the present disclosure. One of ordinarily skill in the art can carry out changes and modifications to the described embodiment without departing from the scope and the spirit of the disclosure that is intended to be limited only by the appended claims.

The invention claimed is:

1. A display panel, comprising at least one cutting section and a functional section; wherein a cross-sectional structure of the display panel comprises:
   a substrate comprising a first sub-portion and a second sub-portion, wherein the first sub-portion corresponds to a position of the cutting section and the second sub-portion corresponds to a position of the functional section;
   a blocking portion disposed on the first sub-portion and comprising a plurality of meshes at a top view angle, the blocking portion is disposed on the cutting section; and
   an encapsulation layer disposed on the blocking portion, wherein a portion of the encapsulation layer is disposed on the cutting section, and a contact surface between the encapsulation layer and the blocking portion is a rugged surface.

2. The display panel of claim 1, wherein the blocking portion is composed of a plurality of mesh lines staggered with respect to each other, wherein a width of the mesh lines ranges from 0.1 μm to 5 μm.

3. The display panel according to claim 1, wherein shapes of the meshes in a top view each comprises at least one of a triangle, a trapezoid, a rectangle, and a circle.

4. The display panel according to claim 1, wherein the encapsulation layer comprises a flat portion and a convex portion, and a height of the blocking portion is greater than a height of the flat portion.

5. The display panel according to claim 4, wherein the height of the blocking portion ranges from 1 μm to 3 μm.

6. The display panel according to claim 1, wherein the cross-sectional structure of the display panel further comprises:
   a switch array layer disposed on the second sub-portion; and
   a flat layer disposed on the switch array layer, wherein the blocking portion and the flat layer are of the same material and are of the same layer.

7. The display panel according to claim 1, wherein the cross-sectional structure of the display panel further comprises:
   a switch array layer disposed on the second sub-portion;
   an anode disposed on the switch array layer; and
   a pixel defining layer disposed on the anode, wherein both the blocking portion and the pixel defining layer are formed in a same process.

8. The display panel according to claim 1, wherein a width of the blocking portion ranges from 0.1 μm to 10 μm.

9. The display panel according to claim 1, wherein material of the blocking portion is an organic insulation material.

10. A display panel, comprising at least one cutting section and a functional section; wherein a cross-sectional structure of the display panel comprises:

a substrate comprising a first sub-portion corresponding to a position of the cutting section;

a blocking portion disposed on the first sub-portion, the blocking portion is disposed on the cutting section; and an encapsulation layer disposed on the blocking portion, a portion of the encapsulation layer is disposed on the cutting section, and a contact surface between the encapsulation layer and the blocking portion is a rugged surface.

11. The display panel according to claim 10, wherein the blocking portion comprises a plurality of meshes at a top view angle.

12. The display panel according to claim 11, wherein the blocking portion is composed of a plurality of mesh lines staggered with respect to each other, wherein a width of the mesh lines ranges from 0.1 μm to 5 μm.

13. The display panel according to claim 11, wherein shapes of the meshes in a top view each comprises at least one of a triangle, a trapezoid, a rectangle, and a circle.

14. The display panel according to claim 10, wherein the encapsulation layer comprises a flat portion and a convex portion, and a height of the blocking portion is greater than a height of the flat portion.

15. The display panel according to claim 14, wherein the height of the blocking portion ranges from 1 μm to 3 μm.

16. The display panel according to claim 10, wherein the substrate further comprises a second sub-portion corresponding to a position of the functional section; wherein the cross-sectional structure of the display panel further comprises:

a switch array layer disposed on the second sub-portion; and a flat layer disposed on the switch array layer, wherein the blocking portion and the flat layer are of the same material and are of the same layer.

17. The display panel according to claim 10, wherein the substrate further comprises a second sub-portion corresponding to a position of the functional section; wherein the cross-sectional structure of the display panel further comprises:

a switch array layer disposed on the second sub-portion;

an anode disposed on the switch array layer; and a pixel defining layer disposed on the anode, wherein both the blocking portion and the pixel defining layer are formed in a same process.

18. The display panel according to claim 10, wherein a width of the blocking portion ranges from 0.1 μm to 10 μm.

19. The display panel according to claim 10, wherein material of the blocking portion is an organic insulation material.

* * * * *